United States Patent [19]

Choa et al.

[11] Patent Number: 5,020,153
[45] Date of Patent: May 28, 1991

[54] TUNABLE NARROWBAND RECEIVER UTILIZING DISTRIBUTED BRAGG REFLECTOR LASER STRUCTURE

[75] Inventors: Fow-Sen Choa, Marlboro; Thomas L. Koch, Holmdel, both of N.J.

[73] Assignee: AT&T Bell Laboratories, Murray Hill, N.J.

[21] Appl. No.: 308,174

[22] Filed: Feb. 8, 1989

[51] Int. Cl.$^5$ .................... G02F 2/00; H01S 3/00; H04B 10/00
[52] U.S. Cl. .................... 455/606; 455/611; 455/619; 372/96
[58] Field of Search .............. 455/606, 611, 619, 609; 372/50, 96

[56] References Cited

U.S. PATENT DOCUMENTS

| Re. 31,969 | 8/1985 | Sell | 455/611 |
|---|---|---|---|
| 4,719,636 | 1/1988 | Yamaguchi | 372/50 |
| 4,852,108 | 7/1989 | Utaka et al. | 372/96 |
| 4,873,691 | 10/1989 | Uomi et al. | 372/50 |
| 4,908,833 | 3/1990 | Chrapiyvy et al. | 372/96 |
| 4,972,514 | 11/1990 | Linke | 455/606 |

OTHER PUBLICATIONS

Lu'C et al., IEEE J. of Quant. Elec., vol. QE-19, No. 6, Jun. 1983, "Electrical Diagnostics of the Amplifier", pp. 1080-1083.
T. Numai et al., Appl. Phys. Lett., 53 (2), Jul. 11, 1988, "Tunable Wavelength Filters Using", pp. 83-85.
A. Alping et al., Elec. Lett., vol. 20, No. 19, Sep. 13, 1984, "100 Mbit/s Laser Diode Terminal", pp. 794-795.
T. L. Koch et al., Elec. Lett., vol. 24, No. 23, Nov. 10, 1988, "Continuously Tunable 1.5 mu m", pp. 1431-1432.
T. L. Koch et al., Appl. Phys. Lett., 53 (12), Sep. 1988, "High Performance Tunable 1.5 mu m InGaAs/InGaAsP", pp. 1036-1038.

Primary Examiner—Reinhard J. Eisenzopf
Assistant Examiner—Kinfe Michael Negash
Attorney, Agent, or Firm—Gregory C. Ranieri

[57] ABSTRACT

A lightwave communication system is disclosed in which an integrated receiver is realized as a distributed Bragg reflector (MQW-DBR) laser structure biased at or below threshold. The receiver functions simultaneously as a tunable filter, optical amplifier, photodetector, and, if desired, as an FSK discriminator. It is also disclosed that the lightwave receiver also is capable of half duplex operation as a lightwave transmitter using the same DBR laser structure. The disclosed receiver eliminates complex coupling of the many different element realized by the integrated, multifunction structure.

8 Claims, 3 Drawing Sheets

TUNABLE NARROWBAND RECEIVER UTILIZING DISTRIBUTED BRAGG REFLECTOR LASER STRUCTURE

TECHNICAL FIELD

This invention relates to the field of lightwave communications and, more particularly, to lightwave receivers utilizing semiconductor laser structures.

BACKGROUND OF THE INVENTION

Densely packed incoherent wavelength-division-multiplexed (WDM) lightwave communications systems have been attracting increasing interest as an alternative system architecture to coherent (heterodyne) systems. A key component in realizing an incoherent WDM lightwave communications system is the lightwave receiver providing filtering, amplification and detection of the lightwave signals. In realizing the lightwave receiver and accomodating the dense packing of the wavelength-division-multiplexed lightwave signals, attention has been focussed primarily on the lightwave or optical filter to the detriment of the lightwave amplifiers and detectors.

Addressing the problem of lightwave filtering, considerable research activity has focussed on the use of distributed feedback (DFB) semiconductor laser structures as in-line filtering devices. Such distributed feedback (DFB) semiconductor laser structures have been operated with a bias set below the threshold lasing current, $I_{th}$. Filtering provided by below threshold operation in DFB lasers has been reported over a tuning range of 8 Å.

The "in-line" nature of the device is necessitated by the requirement for subsequent amplification and detection of the received lightwave signals. Moreover, as in-line elements, the laser structures are transmissive. By its very nature and use, the in-line element accepts a lightwave signal as input (usually through one facet or end face) and performs the desired function such as filtering on the signal to provide a lightwave signal as output (usually through another facet opposite the one facet). In other words, the in-line element as realized by the DFB semiconductor laser structure accepts lightwave signals at one end and processes the signals internally so that they emerge as output at an opposite end. In so doing, the lightwave signals appear to traverse the in-line element.

Other in-line elements mentioned above for accomplishing lightwave signal reception are amplifiers and detectors. Travelling wave structures (one pass) and Fabry-Perot structures (multi-pass) have been proposed for the optical amplification elements. Generally, a diode structure such as a photodiode or avalanche photodetector is employed to detect lightwave signal activity and, as a result, translate lightwave signal activity into corresponding electrical signal activity.

In an effort to reduce the overall number of elements in a lightwave receiver, semiconductor laser structures have been employed to act as dual-function in-line devices. For example, in Elect. Lett., Vol 20, No. 19, pp. 794–5, a buried heterostructure laser operated with an applied forward bias at a point below threshold (the lasing current threshold, $I_{th}$) exhibited simultaneous lightwave amplification and detection. The buried heterostructure laser was connected in a bus configuration as a regenerator or repeater so that lightwave signals received by the laser traversed the laser and were emitted for further transmission on the bus configuration. In the intended use described in the cited reference, the dual-function in-line element (buried heterostructure laser) was, of necessity, a transmissive element.

SUMMARY OF THE INVENTION

Multifunctional operation including amplification, filtering and detection of received lightwave signals has been achieved in an integrated lightwave receiver including a distributed Bragg reflector (DBR) laser structure wherein the laser structure is biased electrically below the lasing threshold current, $I_{th}$. Tunable filtering has been accomplished by applying an appropriate electrical bias to a Bragg section of the DBR laser structure. Tunability has been exhibited over a wider range ($\approx 90$ Å) for the multifunction receiver implementation of the DBR laser structure than for individual DFB laser structure filters ($= 8$ Å).

BRIEF DESCRIPTION OF THE DRAWINGS

A more complete understanding of the invention may be obtained by reading the following description of specific illustrative embodiments of the invention in conjunction with the appended drawing in which.

DETAILED DESCRIPTION

In accordance with the principles of the present invention, a distributed Bragg reflector (DBR) laser structure is employed as an integrated receiver within a lightwave communication system. The DBR laser structure is appropriately biased electrically in the vicinity of the lasing threshold ($I_{th}$) to operate as a multifunctional element by performing the integrated operations of resonant amplification, filtering and detection in response to received lightwave signals. By electrically biasing the Bragg section of the DBR laser structure, it is possible to tune the filtering to occur at a desired wavelength. Bandwidth of the filter response is sufficiently narrow to have application to densely-packed WDM lightwave systems.

Figure 1:
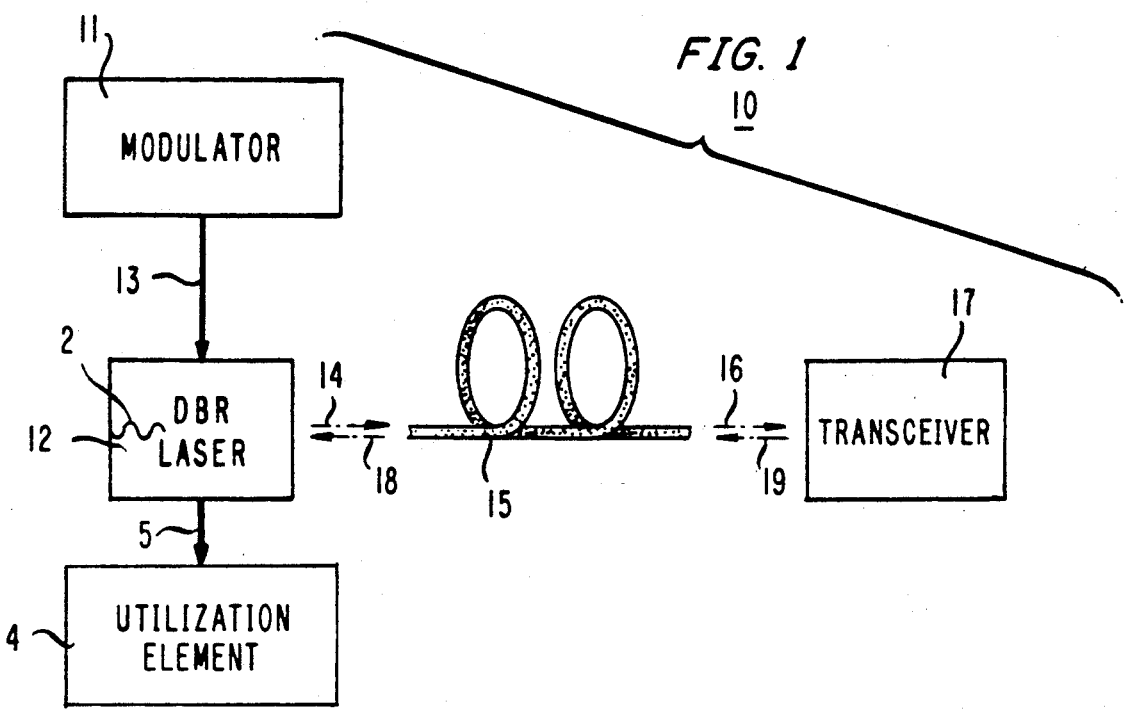
FIG. 1 is a simplified schematic diagram of a lightwave communication system in accordance with the principles of the invention.

FIG. 1 shows a simplified schematic diagram of bidirectional lightwave communication system 10 employing frequency or intensity modulation over a common lighwave transmission medium. Lightwave communication system 10 includes remote transceiver 17, transmission medium 15 and a local transceiver including modulator 11, DBR laser structure 12 and data utilization element 4. Transmission medium 15 is optically coupled to both the local transceiver and remote transceiver 17 for supporting propagation of lightwave signals from the local transceiver to the remote transceiver. In this configuration, the DBR laser structure 12 may be biased above or below threshold to provide transmission or reception in a half-duplex manner. As a transmitter, DBR laser structure 12 generates and supplies modulated signal 14 to transmission medium 15. As a receiver, DBR laser structure 12 obtains lightwave signal 18 from transmission medium 15.

Remote is intended to mean any location away from the local transceiver either in a microscopic sense such as being co-located on the same semiconductor chip or in a macroscopic sense such as being geographically separated.

As described briefly above, the local transceiver comprises modulator 11 connected via path 13 to distributed Bragg reflector (DBR) laser structure 12. Modulator 11 provides the desired modulation of DBR laser structure 12 so that lightwave signal 14 is generated as a frequency or intensity modulated signal. As contemplated in one embodiment, modulator 11 may be electrically connected to DBR laser structure 12 for direct modulation by varying the current applied to the laser. Alternatively, modulator 11 may be optically connected to DBR laser structure 12 as an in-line element for frequency modulating lightwave signals generated by DBR laser structure 12. When the local transceiver is operated in a transmission mode, the injection current is sufficient to bias the laser structure above the lasing threshold.

For receiving lightwave signals 18 from lightwave transmission medium 15, the local transceiver also includes data utilization element 4 connected electrically to the DBR laser structure 12 via path 3. The utilization element 4 senses voltage variations from the DBR laser structure 12 caused by refractive index changes and quasi-Fermi level separation in response to incident lightwave signals 18 entering the resonator of DBR laser structure 12 and, as a result, amplifying the signal photon number and causing an equal number of carriers to recombine in the active layer of DBR laser structure 12. When operated in a reception mode, DBR laser structure 12 is biased in the vicinity of the lasing threshold, usually, in the range less than 1.25 $I_{th}$. It should be noted that, as the bias current exceeds the threshold $I_{th}$, beating of the received lightwave signal may occur with the signal internally generated by the DBR laser structure. Also, as the bias current is reduced below threshold to approximately 0.4 $I_{th}$, the amount of resonant amplification is similarly reduced. Results described below for a multiple quantum well (MQW) DBR laser structure were achieved with an electrical bias of approximately 0.99 $I_{th}$.

At remote transceiver 17, lightwave signals 16 are received from the local transceiver and lightwave signals 19 are generated and transmitted to the local transceiver.

Transceiver 17 accepts lightwave signal 16 from the transmission medium. Based upon the system architecture and the actual function of the receiver, transceiver 17 operates on received lightwave signal 16 in a prescribed manner. For example, the receiver may provide coherent detection via homodyne or heterodyne reception of lightwave signal 16. The need for local oscillators at the receiver may be eliminated by including in M-1 bandpass optical filters such as Fabry-Perot filters tuned to M-1 different wavelengths included in lightwave signal 14, an M-ary FSK signal. In the latter configuration, the M-ary FSK signal is detected and output as an M-ary ASK signal.

Modulation techniques for impressing information onto a lightwave signal include frequency modulation, amplitude modulation or intensity modulation. Frequency modulation is understood to include all forms of frequency modulation whether analog or digital. Hence, use of specific terms such as FM (frequency modulation) or FSK (frequency-shift-keying) is intended to help the reader understand the principles of an embodiment of the invention without being limiting to the scope of this invention. Moreover, the term FSK is understood to include variations such as binary FSK and M-ary FSK. Finally, it is contemplated that other modulation techniques such as intensity modulation, either continuous (AM or IM) or discrete (M-ary ASK, M=2,3, ... ), and phase modulation, either continuous (PM) or discrete (M-ary PSK, M=2,3, ... ), may be used in conjunction with frequency modulation without departing from the spirit and scope of the principles of the present invention.

Transmission medium 15 provides a propagation path for lightwave signals between the lightwave transmitter and the lightwave receiver. In general, transmission medium 15 is understood to include dielectric waveguides such as optical fiber, semiconductor waveguides, metal-indiffused lithium niobate or lithium tantalate waveguide elements, and the like. Of course, other elements such as combiners, couplers, star distribution networks, switching elements, optical amplifiers, signal regenerators, reconditioners, and repeaters, and the like may be present within transmission medium 15 without any loss of generality or applicability for the principles of the present invention. In its simplest embodiment, transmission medium 15 supports optical propagation of an input signal, lightwave signal 14 or 19, until an output signal, lightwave signal 16 or 18, is ultimately delivered to the receiver at the other end of the transmission medium.

It is understood by those skilled in the art that lightwave system 10 may be included without any loss of generality in a larger lightwave system such as a wavelength division multiplexed (WDM) system or the like.

Embodiments of the modulator, transmission medium and receiver described above are well known to those skilled in the art. Accordingly, further discussion will provide a more detailed description of the transmitter and, particularly, DBR laser structure 12.

It should be noted that grating 2 is shown positioned in the Bragg section of DBR laser structure 12 opposite to the coupling to transmission medium 15.

Figure 2:
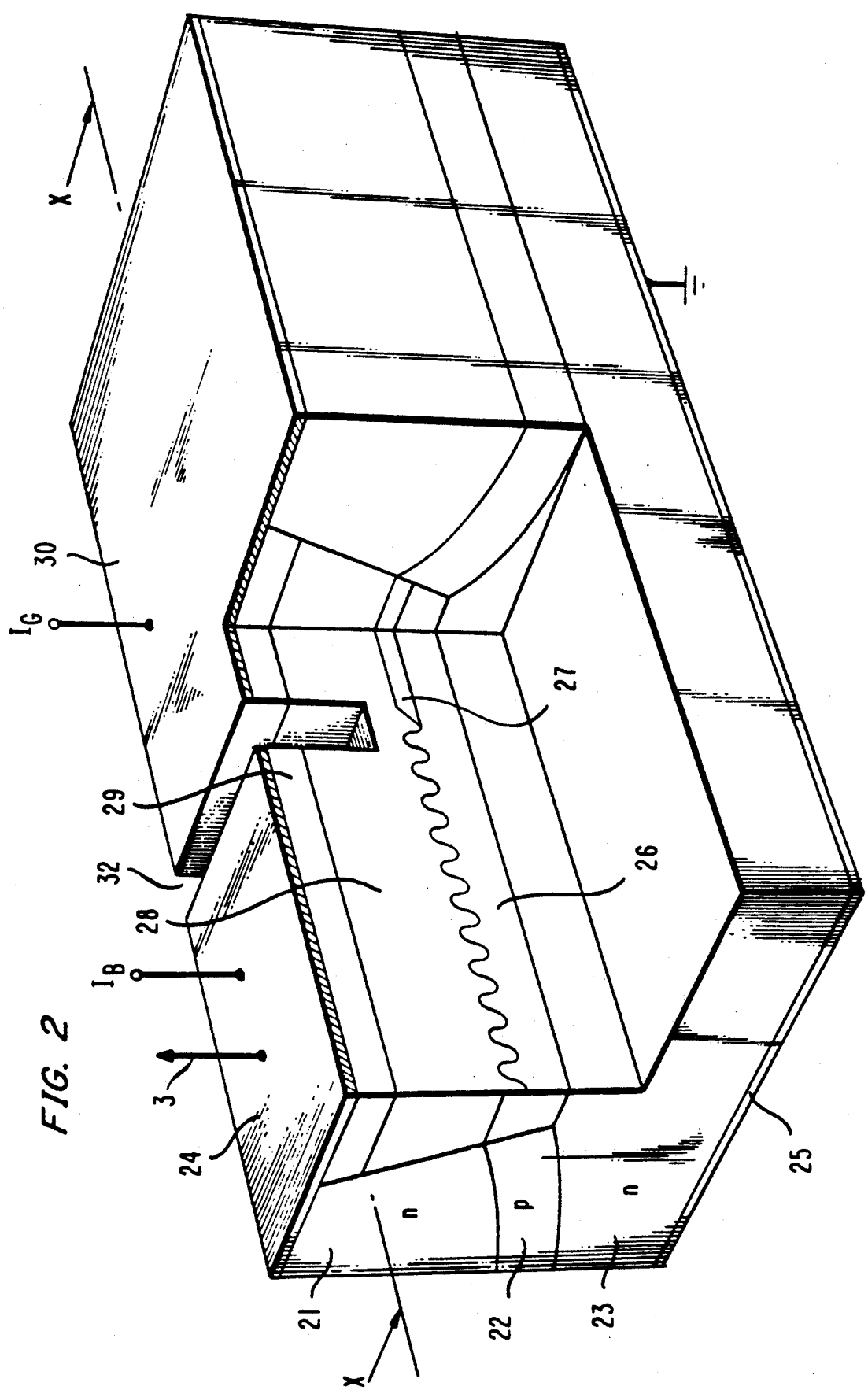
FIG. 2 is a cross-sectional and cutaway view of a distrubuted Bragg reflector semiconductor laser in perspective view for use in the lightwave system of FIG. 1 in accordance with the principles of the invention.

FIG. 2 shows a perspective cross-sectioned and cutaway view of an exemplary distributed Bragg reflector semiconductor laser structure for use as DBR laser structure 12 in lightwave system 10 in accordance with the principles of the invention. The DBR laser structure shown in FIG. 2 is a buried heterostructure having a reversed-bias p-n blocking region. Other structures such as buried ridge, crescent or V-groove, double channel planar buried heterostructure, semi-insulating blocking region planar buried heterostructure and the like are contemplated for use as embodiments of DBR laser structure 12.

Semiconductor structures such as the one shown in FIG. 2 are grown using epitaxial growth techniques such as liquid phase epitaxy, molecular beam epitaxy, chemical beam epitaxy and vapor phase epitaxy. These techniques are described in the literature and are well known to those skilled in the art. See, for example, H. C. Casey et al., *Heterostructure Lasers*, Vols. A and B, Academic Press (1978). Also, see U.S. Pat. No. 4,023,993 for a description of a method for making a distributed feedback laser which is similar to the laser heterostructure in the FIGS.

As shown in FIG. 2, the DBR laser structure includes an n-type Sn:InP substrate 23 on which the reversed-bias p-n blocking region and the buried heterostructure are grown. Contact layers 24, 30 and 25 are shown as broad area metallic contacts deposited on top and bottom (contact 25) surfaces of the DBR laser structure for biasing and current injection. Current injection to the gain section via terminal $I_G$ is used for creating a lasing or an amplifying condition in the gain section of the DBR laser structure. Current injection is optional for the Bragg reflector region via contact 24 and terminal $I_B$. Biasing via $I_B$ is useful for tuning the Bragg section to a particular wavelength of interest. Standard ohmic contact fabrication techniques such as multi-layer evaporation of metal films, alloy evaporation, sputtering and annealing may be employed to realize the ohmic contacts for the particular DBR laser structure. In the laser structure shown in FIG. 2, contacts 24 and 30 are standard Au-Zn contacts whereas contact 25 is an evaporated Au-Ge-Ni contact.

Using standard epitaxial growth techniques, a heterostructure is grown on substrate 23 in the following order: an additional n-type Sn:InP buffer layer (not shown) approximately 1 μm thick; an n-type guide layer 26 comprising Sn:$In_xGa_{1-x}As_yP_{1-y}$ approximately 0.25 μm thick and having suitable mole fractions x, y for approximately 1.3 μm photoluminescence wavelength; an optional InP stop etch layer (see FIG. 3, layer 33) approximately 250 Å thick; an undoped quaternary ($In_xGa_{1-x}As_yP_{1-y}$) active layer 27 approximately 0.1 μm thick and having suitable mole fractions x and y to produce a characteristic (phptoluminescence) wavelength $\lambda_p$ substantially at the peak of the gain profile curve as desired—in this example, the characteristic wavelength is selected to be approximately 1.3 μm; a p-type Zn:InP cladding layer 28 approximately 3 μm thick; and p-type quaternary cap layer 29 approximately 0.7 μm thick. Standard stripe masking using photolithography and etching techniques (for example, bromine methanol etch) are employed to produce the heterostructure mesa.

Figure 3:
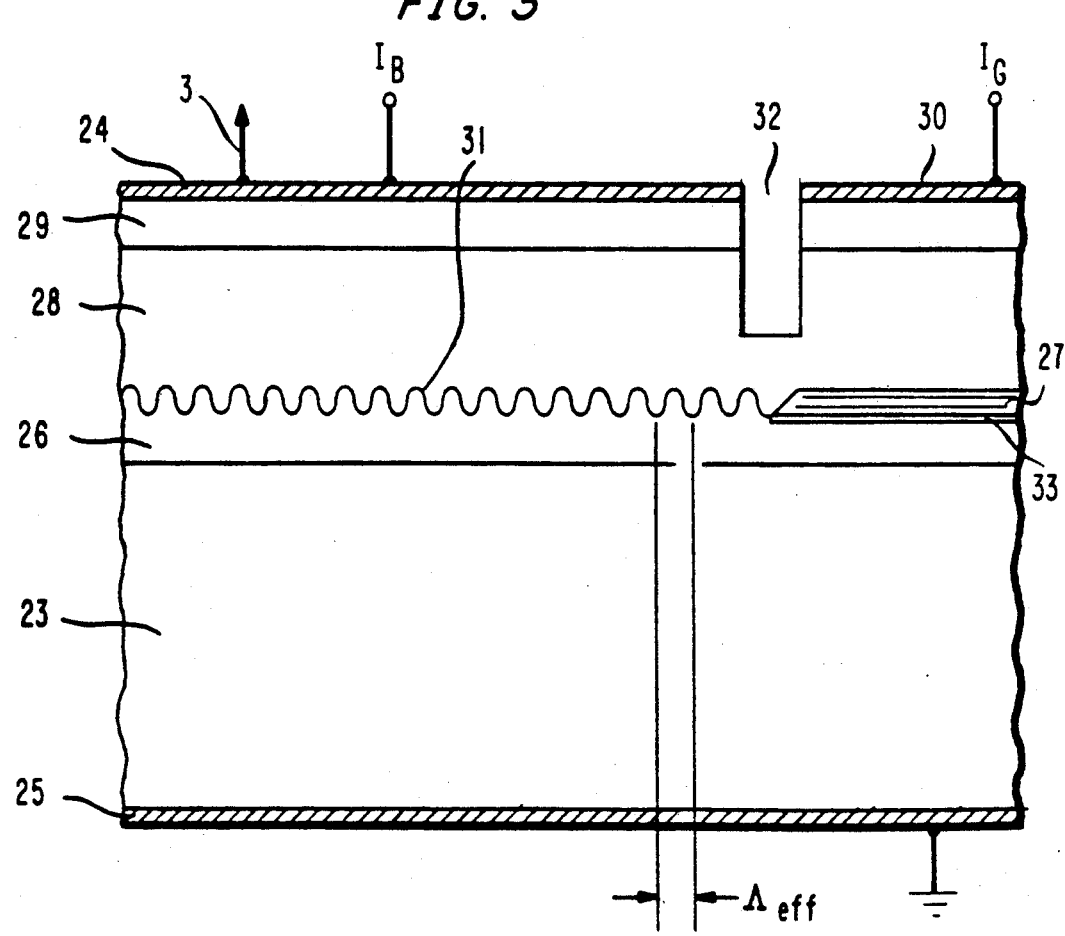
FIG. 3 is a cross-sectional view of an alternative embodiment of the laser from FIG. 2 as an MQW-DBR viewed through section line X—X.

Although it has been shown in FIG. 3 as an alternative embodiment of the DBR laser structure, it is well known to those skilled in the art that active layer 27 may comprise a multiple quantum well region. See *Appl. Phys. Lett.*, 53 (12), pp. 1036 et seq. (1988). In one embodiment, the active layer 27 of an MQW-DBR laser structure comprises four well layers of InGaAs (80 Å thickness) with InGaAsP (1.3 μm photoluminescence wavelength) barrier layers (100 Å thickness).

An intermediate step in the process is to remove a portion of the active layer 27 and possibly the optional stop etch layer from the Bragg reflector region and to place a corrugation, for example, on the surface of layer 26 in the Bragg reflector region using standard masking and etching techniques.

After the heterostructure mesa is formed, successive growth steps for p-blocking layer 22 and n-blocking layer 21 are performed over the substrate 25. Blocking layer 22 comprises Zn:InP approximately 0.5 μm thick and blocking layer 21 comprises Sn:InP to a thickness sufficient to substantially planarize the entire semiconductor structure for contacting.

It is understood that isolation groove 32 is formed by etching, for example, a portion of the heterostructure to create electrical isolation between the Bragg reflector region and the gain region. Other techniques such as ion implantation and the like are contemplated for use in place of the isolation groove 32.

It is understood that dopant concentrations of approximately $10^{17}$ to $10^{18}$ cm$^{-3}$ are suitable for the Sn and Zn dopants in the layers of the DBR laser structure described above. After final preparation, the laser structure is cleaved to produce at least two end facets in planes perpendicular to a direction of light propagation supported in the heterostructure. Since the laser structure shown has a corrugation grating as the integrated feedback structure between the facets, it is generally acceptable practice to apply anti-reflection coatings to at least the end facet of the Bragg section to reduce end facet reflections to a minimum.

Also shown in FIGS. 2 and 3, the feedback structure of the DBR laser structure includes a corrugation grating 31 which is formed in guide layer 26. Shape, depth and pitch or period of the grating are variable and depend on the grating placement together with the result desired therefrom.

In principle, the feedback structure of the DBR laser structure includes spatially periodic perturbations in the transmission characteristics of the laser waveguide formed substantially continuously along the direction of lightwave propagation in the laser waveguide and substantially transverse to the propagation direction of optical energy in the waveguide. Spatially periodic perturbations of the transmission characteristic of the waveguide may take the form of variations in gain, index of refraction, propagation constant, or other parameter of the waveguide medium for the laser.

In accordance with the principles of this invention, the desired period of the grating effective over the guiding region of the laser in the Bragg reflector region is given as an effective period, $\Lambda_{eff} = \lambda_p M/2\tilde{n}$, where $\lambda_p$ is the characteristic wavelength substantially at the gain peak or gain maximum for the gain region of the semiconductor structure, M is the order of the grating expressed as an integer greater than or equal to one, and n is the modal or effective index of refraction for the waveguide mode of the semiconductor laser. It is contemplated that, while transverse positioning of the grating lines is desired, an angular displacement (twist) of the grating lines may occur so that the grating lines lie substantially transverse to the direction of lightwave propagation for the DBR laser structure.

It is contemplated that first (M=1) or higher order (M=2,3, ... ) integrated feedback structures such as corrugation gratings may be utilized. Such gratings may be fabricated using standard electron beam, photolithographic and/or holographic patterning techniques with the necessary subsequent wet or dry etching steps. The grating shape may be sinusoidal as shown in FIGS. 2 and 3 or triangular, rectangular, trapezoidal, semi-circular or some other known complex function. For various grating profiles and fabrication techniques, see *Elect. Lett.*, Vol. 19, No. 25/26, pp. 1076–7 (1983).

Positioning of the grating with respect to the guide layer can be varied so that the grating may be on the substrate below the guide layer, or on the guide layer, or on some other layer near the guide layer in the Bragg reflector region. Of course, grating coupling strength must be considered when selecting a grating position because the grating coupling strength is determined by the grating position vis-a-vis the waveguide mode, the grating or corrugation depth measured from peak to trough, and the difference between refractive indices for the materials bounding the corrugation or grating.

In the exemplary embodiment shown in FIGS. 2 and 3, a first order grating is shown with an effective period $\Lambda_{eff}$ which satisfies the desired criterion described above. The corrugation grating shown in the FIGS. has a pitch of approximately 2350 Å and a depth of approximately 800 Å. ($\lambda_B$).

Of course, the Bragg grating may be detuned to a wavelength longer than the photoluminescence wavelength for increased linewidth enhancement and improved FSK operation whereas detuning toward wavelengths shorter than the photoluminescence wavelength is useful for intensity modulation systems. In order to accomplish detuning as described above, it is necessary to select the amount of wavelength detuning desired. Using standard calculation techniques which are well known to those skilled in the art, the modal index of refraction of the laser structure is determined using the compositions and layer dimensions for the DBR laser. Index values are obtained from *IEEE J. of Quant. Elect.*, QE-21, pp. 1887 et seq. (1985).

Detuning the grating period to be such that the Bragg wavelength is longer than the wavelength of the gain peak for the semiconductor material causes the resulting DBR laser structure to have an unusually large linewidth enhancement factor, $\alpha$. See U.S. Pat. No. 4,905,253. For general discussion of measurement of the linewidth enhancement factor, see the following articles: *IEEE J. of Quant. Elect.*, QE-18, pp. 259 et seq. (1982); *Appl. Phys. Lett.*, 42 (8), pp. 631 et seq. (1983); *Elect. Lett.*, 23, pp. 393-4 (1987); and *Elect. Lett.*, 22, pp. 580-1 (1986). As a result of detuning as described above, the resulting DBR laser provides a large carrier-mediated FM response for reducing current drive requirements and also for flattening the FM response to be substantially uniform.

Typical Bragg sections have a length between 150 and 300 μm while the gain region has length typically between 250 and 600 μm.

In an example from experimental practice, a broadly tunable multiple-quantum-well (MQW) DBR laser (see FIG. 3) functioned as a completely integrated narrowband tunable incoherent receiver. Biased just below threshold (0.99 $I_{th}$) via terminal $I_G$, the device functions simultaneously as a tunable filter, resonant optical amplifier, photodetector, and if desired, an FSK discriminator. Using identical devices for both an FSK transmitter and an FSK receiver, FSK transmission has been accomplished at speeds up to 250 Mb/s with a preliminary, unoptimized sensitivities in the $\sim -30$ dBm range for $10^{-9}$ BER. Speed is limited by the transmitter FM response, and independent speed measurements indicate a receiver bandwidth of at least 1.7 GHz.

Since the resonant amplifier/filter/detector of laser structure 12 can then be the terminal device, it eliminates the need for an in-line transmission configuration. The device in this configuration has been referred to as a TRAP, which stands for Tunable Resonant Amplifying Photodetector. When the laser structure is biased below threshold, it functions as a resonant optical amplifier. (See FIG. 5.) By adjusting the current to the Bragg section, $\sim 20$ GHz continuous electrical tuning of the TRAP is possible, and temperature adjustments allow access to the entire tuning range. While two-section devices were used here, three-section geometries offer continuous electronic coverage of all wavelengths throughout the tuning range. Adjustment of current to the Bragg section via terminal $I_B$ is described at *Appl. Phys. Lett.*, 53 (12), pp. 1036-8 (1988). Three section devices having a phase control section are described at *Elect. Lett.*, Vol. 24, No. 23, pp. 1431-2 (1988).

Photodetection in DBR laser structure 12 occurs during the optical amplification process due the stimulated emission and the concomitant carrier recombination in the active layer. This changes both the index of refraction and the quasi-Fermi level separation. The latter changes the external voltage across the constant-current forward biased laser diode sensed via path 3, with the low diode impedance making the detector function as a voltage source. This differs from the reverse biased case where the incoming signal creates carriers, the current is of opposite sign, and the high impedance laser diode functions as a current source.

Figure 4:
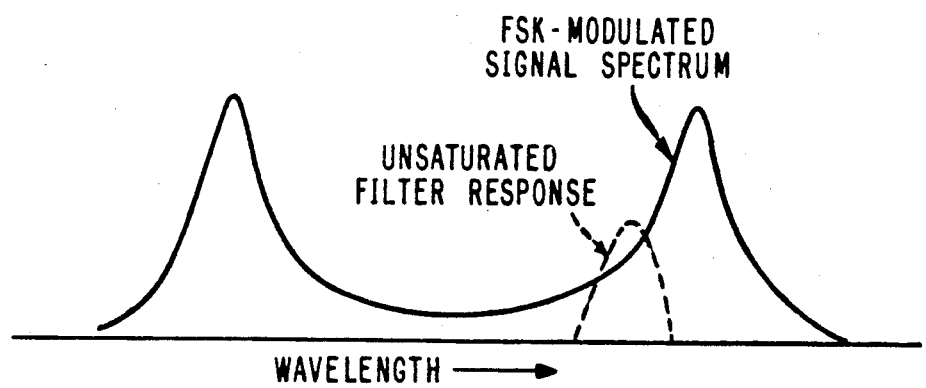
FIG. 4 is a plot showing the placement of the filter wavelength relative to the FSK wavelengths.

The MQW-DBR (TRAP) laser structure 12 has been operated in two distinct modes of operation: (1) FSK discriminating, and (2) chirp-free intensity modulation detecting. Improved FSK reception results are obtained when the filter of the Bragg section of the laser structure is tuned to a wavelength which is shorter than the longest FSK wavelength as shown in FIG. 4. The long wavelength FSK mode pulls in the Bragg filter for a larger voltage change, while the short wavelength FSK mode has a small response. This is understood as follows. As the stimulated emission reduces the carrier density, the index increases and thus the filter center wavelength increases. Thus signals on the short wavelength side "repel" the filter, while signals on the long wavelength side "pull in" the filter towards the signal. The largest electrical signal, or voltage change, occurs when the signal induces the largest carrier density change. This will thus occur on the long wavelength side of the filter when the signal is strong enough to induce some gain saturation. At long enough wavelength, the initial unsaturated resonant filter response is too small to induce significant stimulated emission to "pull in" the filter, and the response abruptly drops as the filter loses its lock on the signal. Since these effects also tend to occur dynamically at the bit rate, the response with strong incident signals can be complex. However, with weaker signals the response is quite straightforward.

Figure 5:
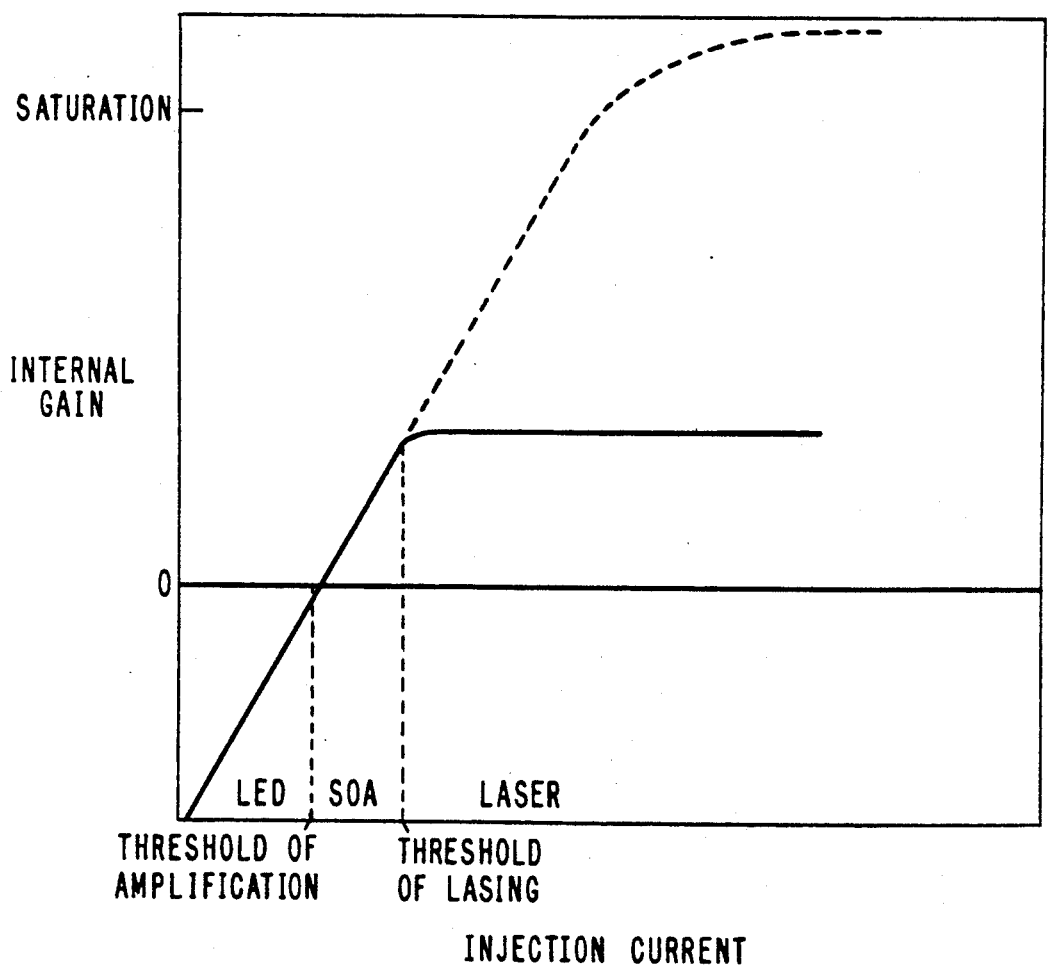
FIG. 5 is a plot of injection current versus internal gain showing various regimes of operation.

In order to better understand the electrical biasing of the gain section via $I_G$, one is referred to FIG. 5. A single laser diode structure can behave as a light emitting diode, an amplifier or a laser depending upon the magnitude of the injection current ($I_G$) with which the gain section is biased. When current is first applied, spontaneous recombination of electrons and holes occurs (LED operation) and lightwave signals coupled from another source will be absorbed. Increasing the current $I_G$ further causes the laser structure to become transparent to incoming lightwave signals and to have gain. As a result, incoming lightwave signals are amplified. The point at which sufficient electrical bias exists for the diode to become a semiconductor optical amplifier (SOA) is the threshold of amplification. As the electrical bias $I_G$ is further increased, the internal gain of the laser structure may exceed the losses causing a lasing condition or the laser structure will continue to amplify incoming lightwave signals until the gain saturates (dashed curve). Both conditions (lasing and saturation) depend upon the reflectivity of the reflection elements of the laser structure. As described above, it is preferred to operate the DBR laser structure 12 in the vicinity of the threshold of lasing over the range 0.75

$I_{th}$ to 1.25 $I_{th}$. In one experiment, operation of the electrical bias $I_G$ at approximately 0.99 $I_{th}$ achieved good results for multifunctional operation of DBR laser structure 12 as an integrated resonant amplifier/filter/detector.

It should be clear to those skilled in the art that the receiver is polarization sensitive for resonant amplifier operation. Polarization maintenance or preservation and/or correction may be required between local and remote transceivers for optimized operation.

It is understood that, while the material system InGaAsP/InP is described above for fabricating the distributed feedback laser, other material combinations may be selected from other semiconductor Group III-V systems such as GaAs/AlGaAs, InGaAs/InAlAs, InGaAs/InGaAlAs, GaAsSb/GaAlAsSb and GaAs/AlAs. In these semiconductor systems, the layers may be lattice-matched to suitable GaAs or InP substrates. Mismatching is also contemplated wherein strained layers are grown over the substrate material. Finally, extension of the device structures is also contemplated to semiconductor compounds in Group II-VI.

We claim:

1. A method for receiving lightwave signals comprising the steps of:
   electrically biasing a distributed Bragg reflector semiconductor laser to a predetermined value for optical amplification in a range below 1.25 of a lasing threshold, $I_{th}$,
   directing said lightwave signals to impinge on said distributed Bragg reflector laser,
   deriving an electrical signal representing said lightwave signals impinging on said distributed Bragg reflector laser by amplifying said lightwave signals, by filtering said lightwave signals, and by translating changes in at least carrier density in a gain region of said distributed Bragg reflector laser into said electrical signal, said changes being caused by said lightwave signals impinging on said distributed Bragg reflector laser.

2. The method defined in claim 1 wherein the step of biasing further includes biasing said distributed Bragg reflector laser to said predetermined value slightly below a lasing threshold, $I_{th}$.

3. The method defined in claim 2 wherein the distributed Bragg reflector laser comprises a gain section and a Bragg section optically coupled together and wherein the step of deriving the electrical signal further includes tuning to a predetermined wavelength by electrically biasing said Bragg section.

4. The method defined in claim 1 wherein the distributed Bragg reflector laser comprises a gain section and a Bragg section optically coupled together and wherein the step of deriving the electrical signal further includes tuning to a predetermined wavelength by electrically biasing said Bragg section.

5. A method for receiving FSK modulated lightwave signals comprising the steps of:
   electrically biasing a distributed Bragg reflector semiconductor laser to a predetermined value for optical amplification in a range below 1.25 of a lasing threshold, $I_{th}$, said distributed Bragg reflector laser comprises a gain section and a Bragg section optically coupled together,
   tuning said Bragg section to a predetermined wavelength by electrically biasing said Bragg section, said predetermined wavelength selected to be between first and second wavelengths associated with said FSK modulated lightwave signals,
   directing said lightwave signals to impinge on said distributed Bragg reflector laser,
   deriving an electrical signal representing said lightwave signals impinging on said distributed Bragg reflector laser by amplifying said lightwave signals, by filtering said lightwave signals, and by translating changes in at least carrier density in a gain region of said distributed Bragg reflector laser into said electrical signal, said changes being caused by said lightwave signals impinging on said distributed Bragg reflector laser.

6. The method defined in claim 5 wherein the step of tuning includes tuning to said predetermined wavelength is substantially closer to said first wavelength, said first wavelength being longer than said second wavelength.

7. A method for communicating via lightwave signals by sending and receiving said lightwave signals using a transceiver, said transceiver including a distributed Bragg reflector semiconductor laser, said method comprising the steps of:
   generating said lightwave signals for transmission by the steps of: electrically biasing said distributed Bragg reflector semiconductor laser to a predetermined value greater than a lasing threshold, $I_{th}$;
   receiving said lightwave signals by the steps of: electrically biasing said distributed Bragg reflector semiconductor laser to a predetermined value for optical amplification in a range below 1.25 of said lasing threshold; directing said lightwave signals to impinge on said distributed Bragg reflector laser; deriving an electrical signal representing said lightwave signals impinging on said distributed Bragg reflector laser by amplifying said lightwave signals, by filtering said lightwave signals, and by translating changes in at least carrier density in a gain region of said distributed Bragg reflector laser into said electrical signal, said changes being caused by said lightwave signals impinging on said distributed Bragg reflector laser.

8. A lightwave communication system comprising a transmitter of lightwave signals, a receiver for receiving said lightwave signals, and a transmission medium for optically coupling said transmitter to said receiver, said receiver comprising a distributed Bragg reflector laser structure responsive to said lightwave signals and to an electrical bias substantially less than a threshold of lasing for said distributed Bragg reflector laser structure for amplifying, filtering and detecting said lightwave signals.

* * * * *